(12) United States Patent
Jeong et al.

(10) Patent No.: US 7,905,961 B2
(45) Date of Patent: *Mar. 15, 2011

(54) LINEAR TYPE DEPOSITION SOURCE

(75) Inventors: Min Jae Jeong, Yongin (KR); Do Geun Kim, Yongin (KR); Hee Cheol Kang, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 588 days.

This patent is subject to a terminal disclaimer.

(21) Appl. No.: 11/515,388

(22) Filed: Aug. 31, 2006

(65) Prior Publication Data

US 2007/0084409 A1    Apr. 19, 2007

(30) Foreign Application Priority Data

Aug. 31, 2005    (KR) .................. 10-2005-0080998

(51) Int. Cl.
C23C 16/00    (2006.01)
(52) U.S. Cl. ........................................... 118/726
(58) Field of Classification Search ............ 118/726
See application file for complete search history.

(56) References Cited

U.S. PATENT DOCUMENTS

| | | | |
|---|---|---|---|
| 2,440,135 A * | 4/1948 | Alexander | 427/248.1 |
| 4,543,467 A * | 9/1985 | Eisele et al. | 392/388 |
| 4,550,411 A | 10/1985 | Stonestreet et al. | |
| 4,845,956 A | 7/1989 | Berntsen et al. | |
| 5,803,976 A | 9/1998 | Baxter et al. | |
| 5,827,371 A | 10/1998 | Colombo et al. | |
| 5,902,634 A | 5/1999 | Maschwitz et al. | |
| 6,101,316 A | 8/2000 | Nagashima et al. | |
| 6,296,956 B1 * | 10/2001 | Hunter | 428/698 |
| 6,562,140 B1 * | 5/2003 | Bondestam et al. | 118/715 |
| 2002/0148402 A1 * | 10/2002 | Kou et al. | 117/13 |
| 2003/0015140 A1 | 1/2003 | Van Slyke et al. | |
| 2004/0163600 A1 | 8/2004 | Hoffmann et al. | |

(Continued)

FOREIGN PATENT DOCUMENTS

CN    1320172    10/2001

(Continued)

OTHER PUBLICATIONS

Patent Abstracts of Japan for Publication No. 11-323552; Date of Publication of Application Nov. 26, 1999 in the name of Azuma et al.

(Continued)

*Primary Examiner* — Keath T Chen
(74) *Attorney, Agent, or Firm* — Christie, Parker & Hale, LLP

(57) ABSTRACT

A linear type deposition source capable of improving a heating efficiency and reducing a heating temperature by using a plate-type heating source and/or improving a cooling efficiency by including a cooling jacket having a cooling water line in a housing. The linear type deposition source includes: a crucible arranged in a deposition chamber, the crucible being for evaporating materials included in the crucible; a heating source for applying heat to the crucible; a housing for isolating the heat emitted from the heating source; an outer wall for anchoring the crucible; and a nozzle unit for spraying the materials evaporated from the crucible. In this deposition source, the heating source is a plate-type heating source, and the housing has a cooling water line so cooling water can flow through the cooling water line.

14 Claims, 1 Drawing Sheet

U.S. PATENT DOCUMENTS

| | | | |
|---|---|---|---|
| 2005/0011448 | A1 | 1/2005 | Iwata |
| 2005/0051096 | A1* | 3/2005 | Horsky et al. ........... 118/723 CB |

FOREIGN PATENT DOCUMENTS

| | | |
|---|---|---|
| CN | 1550569 | 12/2004 |
| CN | 1555089 A | 12/2004 |
| CN | 1626698 A | 6/2005 |
| DE | 44 39 519 C1 | 4/1996 |
| JP | 61-009574 | 1/1986 |
| JP | 61-220414 | 9/1986 |
| JP | 01-159369 | 6/1989 |
| JP | 03-007883 | 1/1991 |
| JP | 5-78826 | 3/1993 |
| JP | 6-299336 | 10/1994 |
| JP | 07-300666 | 11/1995 |
| JP | 08-092733 | 4/1996 |
| JP | 09-111441 | 4/1997 |
| JP | 11-323552 | 11/1999 |
| JP | 2000-012218 | 1/2000 |
| JP | 2000 504645 | 4/2000 |
| JP | 2000-160328 | 6/2000 |
| JP | 3608415 | 10/2004 |
| JP | 2005-015869 | 1/2005 |
| KR | 2002-0000356 | 1/2002 |
| KR | 2002-0086761 | 11/2002 |
| KR | 2003-0038268 | 5/2003 |
| KR | 10-2004-0081264 | 9/2004 |
| TW | 200710241 | 3/2007 |
| TW | 200714725 | 4/2007 |

OTHER PUBLICATIONS

Patent Abstracts of Japan for Application No. 11-016546; Filed Jan. 26, 1999 in the name of Oshima et al.
Korean Patent Abstract for Publication No. 10-2003-0038268; Date of Publication of Application May 16, 2003 in the name of Baek et al.
TIPO Examination Report dated Dec. 18, 2008 for corresponding Taiwan application 095131093 with English translation, indicating relevance of references listed in this IDS.
Japanese Office action dated May 19, 2009, for Japanese application 2006-113737, noting listed references in this IDS.
Japanese Office action dated Jul. 28, 2009, for Japanese application 2006-191897, noting listed references in this IDS.
Patent Abstracts of Japan, Publication No. 2005-015869, dated Jan. 20, 2005, in the name of Junichiro Sakata.
Japanese Office action dated Jul. 21, 2009, for corresponding Japanese application 2006-198618, noting listed reference in this IDS, as well as JP 61-220414, previously filed in an IDS dated Dec. 12, 2006, and JP 2000-160328 and JP 2000-012218 previously filed in an IDS dated Aug. 17, 2009.
SIPO Office action dated Oct. 24, 2008 for Chinese Application 200610112373.3 with English translation, noting listed U.S. reference in this IDS, namely, U.S. Publication 2003/0015140.
TIPO Examination Report dated Jan. 22, 2009 for Taiwanese Application 095131101, noting listed U.S. reference in this IDS, namely, U.S. Patent 4,845,956 and JP 61-220414.
TIPO Examination Report dated Dec. 17, 2008 for Taiwanese Application 095131097, noting listed reference in this IDS, namely, TW 200714725.
English translation of German application DE 44 39 519 listed above.
U.S. Office action dated May 27, 2009, for related U.S. Appl. No. 11/515,364, noting listed German reference and U.S. references in this IDS, namely, U.S. Publication 2003/0015140, and U.S. Patents 5,827,371 and 6,101,316.
Patent Abstracts of Japan, Publication No. 61-220414, dated Sep. 30, 1986, in the name of Toshio Fujii et al.
Patent Abstracts of Japan, Publication No. 05-078826, dated Mar. 30, 1993, in the name of Muneyuki Imafuku et al.
Patent Abstracts of Japan, Publication No. 06-299336, dated Oct. 25, 1994, in the name of Yukio Kikuchi et al.
Korean Patent Abstracts, Publication No. 10200200000356 dated Jan. 5, 2002, in the name of Geon Hui Kim et al.
Korean Patent Abstracts, Publication No. 1020040081264, dated Sep. 21, 2004, in the name of Hun Kim et al.
SIPO Office action dated Oct. 24, 2008 for corresponding China application 2006101277093, with English translation indicating relevance of listed references in the IDS.
U.S. Office action dated Jun. 12, 2009, for related U.S. Appl. No. 11/514,318, noting listed U.S. reference in this IDS.
Chinese Office action dated Apr. 17, 2009, for corresponding Chinese application 200610112370.X, with English translation noting listed references in this IDS, as well as U.S. Publication 2003/0015140 filed in an IDS dated Jun. 4, 2009.
U.S. Office action dated Nov. 27, 2009, for related U.S. Appl. No. 11/515,364, noting reference listed in this IDS.
Japanese Office action dated Mar. 16, 2010, for corresponding Japanese Patent application 2006-191897, noting listed references in this IDS.
Patent Abstracts of Japan, Publication No. JP 01-159369, dated Jun. 22, 1989, in the name of Tada Isao.
Japanese Office action dated Apr. 20, 2010, for corresponding Korean Application No. 10-2005-0080996.
U.S. Office Action dated Jun. 15, 2010, for related U.S. Appl. No. 11/514,318.

* cited by examiner

LINEAR TYPE DEPOSITION SOURCE

CROSS-REFERENCE TO RELATED APPLICATION

This application claims priority to and the benefit of Korean Patent Application No. 10-2005-0080998, filed on Aug. 31, 2005, in the Korean Intellectual Property Office, the entire content of which is incorporated herein by reference.

BACKGROUND

1. Field of the Invention

The present invention relates to a linear type deposition source, and, more particularly, to a linear type deposition source capable of improving a heating efficiency and reducing a heating temperature by using a plate-type heating source and/or improving a cooling efficiency by including a cooling jacket having a cooling water line (or lane) in a housing.

2. Discussion of Related Art

Generally, there are several ways to form a thin film on a substrate, including physical vapor depositions (such as a vacuum evaporation method, an ion-plating method, and a sputtering method), and chemical vapor depositions by a gas reaction.

In various fields, such as a semiconductor device, an organic electroluminescence device, or other optical coatings, a thin film has been formed using the vacuum evaporation method. In the vacuum evaporation method, a deposition source of an indirect heating system (or an induced heating system) has been used as the deposition source.

The deposition source of the indirect heating system is used to heat deposition materials received into a crucible to a predetermined temperature (for example, about 1,200° C. for Al) to evaporate the deposition materials. The deposition source includes a heater for heating the crucible, and a nozzle unit for spraying the deposition materials emitted from the heated crucible onto a substrate.

However, it is more difficult to use the indirect heating system to carry out a large-size deposition when compared to sputtering deposition, etc. Accordingly, a plurality of deposition sources may need to be linearly arranged or linear deposition sources may need to be used so as to carry out the large-size deposition using the indirect heating system.

In using a linear type deposition source as described above, a linear heating source is used to heat a crucible. Metallic materials, such as Ta, Mo, and W, are used as the linear heating source, and the linear heating source is heated using a resistive heating system.

However, the above described linear heating source may easily break due to curing of the materials since it is heated to a high temperature so as to properly elevate the temperature of a crucible to a desired temperature, and the high temperature of the linear heating source may be above the desired temperature.

Also, since the linear shape of the linear heating source only heats a certain area of the crucible on a plane and the linear type deposition source includes other members of the linear type deposition source besides the crucible (i.e., an additional isolating part for isolating the heat transfer to a housing, an outer shell, etc.), the linear heating source has a low heat transfer efficiency (based on an applied electric power).

SUMMARY OF THE INVENTION

An aspect of the present invention provides a linear type deposition source capable of improving a heating efficiency and reducing a heating temperature by using a plate-type heating source, having a rapid temperature elevation speed, preventing breaks of the heating source, and/or improving a cooling efficiency by including a cooling jacket having a cooling water line (or lane) in a housing.

An embodiment of the present invention provides a linear type deposition source including: a crucible arranged in a deposition chamber, the crucible being for evaporating materials included in the crucible; a heating source for applying heat to the crucible; a housing for isolating the heat emitted from the heating source; an outer wall for anchoring the crucible; and a nozzle unit for spraying the materials evaporated from the crucible. In this deposition source, the heating source is a plate-type heating source, and the housing has a cooling water line so cooling water can flow through the cooling water line.

The plate-type heating source may be a plate-type resistive heating source. The plate-type resistive heating source may be made of a material selected from the group consisting of carbon composites, SiC, graphite, and combinations thereof. The plate-type resistive heating source may provide a heating temperature ranging from about 400° C. to 900° C.

Also, the linear type deposition source of the present invention may further include a reflector between a part of the outer wall and a part of the housing to prevent a heat transfer from the heating source to a direction of the outer wall. The reflector may include at least two (2) reflectors. In addition, the reflector may include at least four (4) reflectors.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Figure 1:
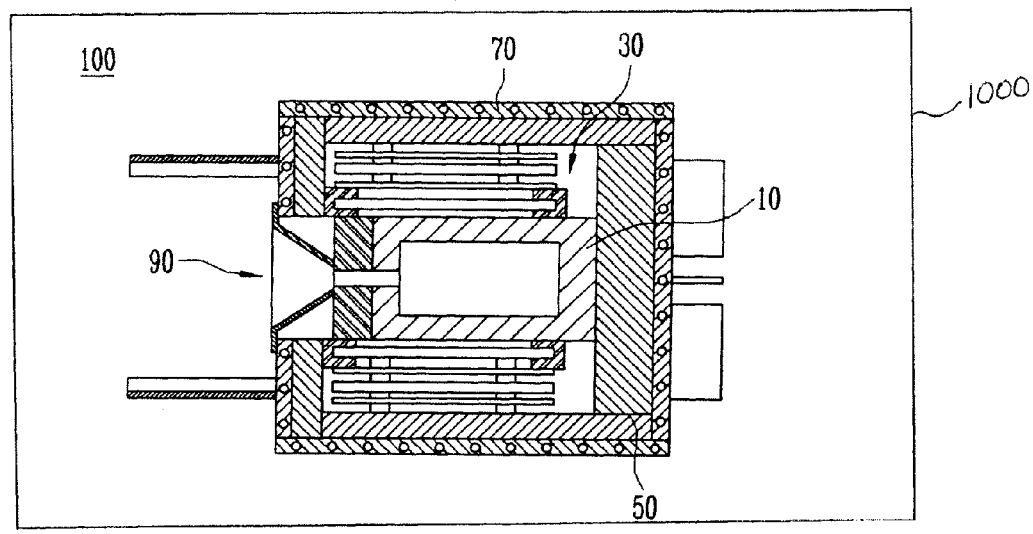
FIG. 1 is an exploded cross-sectional view showing a linear type deposition source according to an embodiment of the present invention.

FIG. 1 is an exploded cross-sectional view showing a linear type deposition source 100 according to an embodiment of the present invention.

The linear type deposition source 100 of FIG. 1 includes: a crucible 10 arranged in a deposition chamber 1000 and for evaporating metals and/or inorganic materials included in the crucible 10; a heating source 30 for applying heat to the crucible 10; a housing 50 for isolating the heat emitted from the heating source 30; an outer wall 70 for anchoring the crucible 10; and a nozzle unit 90 for spraying materials evaporated from the crucible 10. In FIG. 1, the heating source 30 has a plate shape (i.e., is a plate-type heating source), and the housing 50 has a cooling water line so that cooling water can flow.

Unlike conventional linear type heating sources, the plate-type heating source 30 of FIG. 1 may more effectively transfer heat to the crucible 10 using a lower temperature, and may elevate the temperature of the crucible 10 more rapidly since it has a larger heat emission area than the conventional linear type heating sources. Also, because the heating source 30 has the plate shape, it may reduce break damages when compared to the conventional linear type heating sources.

The crucible 10 includes deposition materials, for example, metals and/or inorganic materials such as LiF, Mg, Ag, and/or Al, and the heating sources 30 are arranged around the crucible 10 to heat the crucible 10.

The crucible 10 and the heating source 30 are installed in the housing 50, and the housing 50 is arranged to isolate a high heat emitted from the heating source 30.

The crucible 10, the heating source 30, and the housing 50 are anchored in the inside of the outer wall 70 to form the linear type deposition source 100.

In addition as shown in FIG. 1, a nozzle unit 90 is arranged through the aforementioned housing 50 in one side of the outer wall 70 to spray the deposition materials evaporated from the crucible 10.

Figure 2:
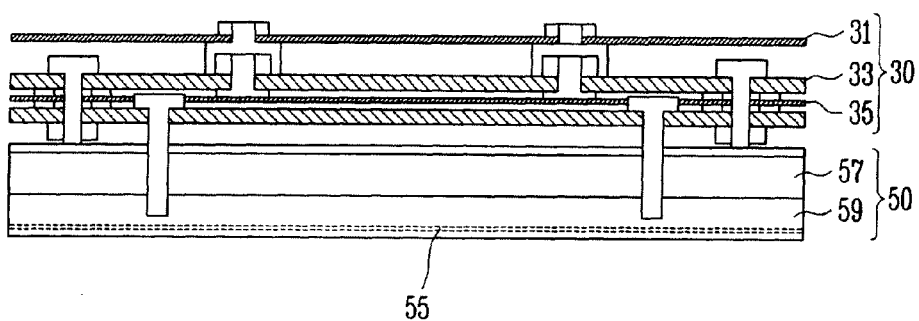
FIG. 2 is a schematic view showing a heating source and a housing of FIG. 1.

FIG. 2 is a schematic view showing the heating source 30 and the housing 50 of FIG. 1.

As shown in FIGS. 1 and 2, the heating sources 30 are installed into an upper portion and a lower portion of the crucible 10, respectively. The heating source 30 includes a plate-type heater 31. The plate-type heater 31 is a resistive heating source, and can be made from a material selected from carbon composites, SiC, and/or graphite. If the heater 31 is made from the material selected from carbon composites, SiC, and/or graphite, the material cost is lower than that of the conventional metallic linear type heater made from a material selected from Ta, Mo, and/or W. In addition, the heater 31 has an improved heating ability since it has the plate shape.

Also, the plate-type heater 31 has a larger planar area than that of the crucible 10 for effective heat transfer to the crucible 10. In order to deposit metals and/or inorganic materials, the heater 31, a plate-type resistive heating source, provides a heating temperature ranging from 400° C. to 900° C.

Supports 33 and a reflector 35 are arranged toward an outer side of the heater 31, and, more particularly, are arranged toward the side of the outer wall 70 from the heater 31. The supports 33 are arranged in pairs to support the reflector 35 between a pair of the supports 33, and also to support the plate-type heater 31 toward a direction in which the crucible 10 is arranged.

The reflector 35 is arranged to isolate the heat emitted from the heater 31 to a direction of the outer wall 70. In FIGS. 1 and 2, since a high heat is required to heat the metals and/or the inorganic materials, there are at least two reflectors 35 in the linear type deposition source 100, and, more particularly, at least two (2) reflectors 35 in which one of the reflectors 35 is for the upper heating source 30 and another one of the reflectors 35 is for the lower heating source 30 in order to isolate the heat.

In FIG. 2, the housing 50 is arranged at the outside of the support 33 supporting the reflector 35, and, more particularly, at the side of the outer wall 70 as shown in FIG. 1. The housing 50 includes a heat insulating part 57, and the heat insulating part 57 is made of a graphite felt, and encloses an entire area of an inner space of the linear type deposition source 100 in which the crucible 10 and the heating source 30 are arranged.

A cooling jacket unit 59 is arranged at an outer side of the heat insulating part 57, and the cooling jacket unit 59 is also included in the housing 50. In FIG. 2, a cooling water line (or lane) 55 is formed in the cooling jacket unit 59, which is cooled by allowing cooling water to flow through the cooling water line 55.

As such, the linear type deposition source 100 shown in FIGS. 1 and 2 may be effectively cooled, while reducing volume occupied, by including the cooling jacket unit 59 in which the cooling water line 55 is formed in the housing 50 itself.

Like the heat insulating part 57 as described above, the cooling jacket unit 59 encloses an entire area of the inner space in which the crucible 10 and the heating source 30 are arranged at the outer side of the heat insulating part 57.

The heating source 30 may be arranged at the upper portion and the lower portion of the crucible 10, respectively. The heating source 30 arranged at the upper portion receives electric power from a first power source (not shown), and the heating source 30 arranged at the lower portion receives electric power from a second power source (not shown), respectively. The first power source and the second power source are connected to be controlled by a controller (not shown), and the first power source and the second power source are arranged so that the electric powers supplied from the first power source and the second power source can be independently controlled by the controller, respectively.

Also, the controller may further include a measurer (not shown) for measuring a deposition rate of the deposition materials emitted from the crucible 10. For an actual measurement of the deposition rate, the measurer (not shown) for measuring the deposition rate is, in one embodiment, arranged along a direction of a substrate (not shown) in the linear type deposition source 100, and arranged in a front surface of the nozzle unit 90 in the linear type deposition source 100. That is, the measure is arranged in a deposition apparatus. Also, the controller may further include a comparer for comparing the deposition rate of the deposition materials, obtained using the measurer for measuring the deposition rate, to an established reference deposition rate.

Accordingly, the electric powers supplied from the first power source and the second power source, controlled by the controller, may be controlled by comparing the actual deposition rate, obtained using the measurer for measuring the deposition rate, to the established reference deposition rate, and therefore the heating of the heating source 30 arranged at the upper portion of the crucible 10 and the heating of the heating source 30 arranged at the lower portion of the crucible 10 may be controlled, respectively.

Figure 3:
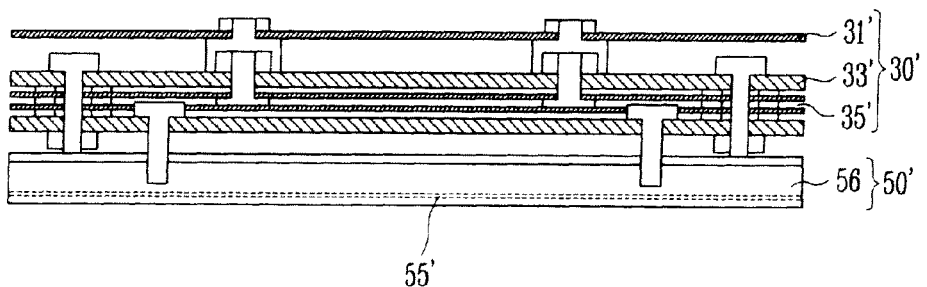
FIG. 3 is a schematic view showing a heating source and a housing according to another embodiment of the present invention.

FIG. 3 is a schematic view showing a heating source 30' and a housing 50' according to another embodiment of the present invention.

Referring to FIG. 3, the heating source 30' has a plate-type heater 31' in the heating source 30'. In addition, the heating source 30' has supports 33' and reflectors 35' that are arranged toward an outer wall (e.g., the outer wall 70) from the heater 31'. The supports 33' are arranged in pairs to support the reflectors 35' between the supports 33', and also to support the plate-type heater 31' toward a direction in which a crucible (e.g., the crucible 10) is arranged.

The reflectors 35' are arranged to isolate the heat emitted from the heater 31' to a direction of the outer wall (e.g., the outer wall 70). In FIG. 3, since a high heat is required for heating the metals and/or the inorganic materials, there are at least two (2) reflectors 35', and, more particularly, at least four (4) reflectors 35' in which at least two (2) of the reflectors 35' are for the upper heating source 30' and at least two (2) of the reflectors 35' are for the lower heating source 30' in order to isolate the heat.

Unlike the embodiment shown above in FIG. 2, a heat insulating part (e.g., the heat insulating part 57) can be omitted in the housing 50' because, in the embodiment as shown in FIG. 3, there are at least four reflectors 35', which primarily isolate the heat emitted from the plate-type heater 31', to improve the heat-isolating efficiency. In FIG. 3, the housing 50' includes a cooling jacket unit 56.

In FIG. 3, a cooling water line 55' is formed in the cooling jacket unit 56, which is cooled by allowing cooling water to flow through the cooling water line 55'.

The housing 50' including the cooling jacket unit 56 encloses an entire area of an inner space in which the crucible (e.g., the crucible 10) and the heating source 30' are arranged, and therefore the cooling jacket unit 56 also encloses the entire area of the inner space.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A linear type deposition source comprising:
   a crucible in a deposition chamber, the crucible for evaporating materials in the crucible;
   a heating source for applying heat to the crucible;
   a housing for isolating the heat emitted from the heating source;
   a pair of supports between the heating source and the housing for supporting the heating source, the pair of supports comprising an inner support and an outer support, the inner support and the outer support each comprising an inside facing the heating source and an outside facing the housing;
   a reflector between the pair of supports for reflecting the heat from the heating source toward the crucible, the outside of the inner support and the inside of the outer support each facing the reflector;
   an outer wall for anchoring the crucible; and
   a nozzle unit for spraying the materials evaporated from the crucible,
   wherein the heating source is a plate-type heating source, and
   wherein the housing has a cooling water line configured for cooling water to flow through the cooling water line.

2. The linear type deposition source of claim 1, wherein the plate-type heating source is a plate-type resistive heating source.

3. The linear type deposition source of claim 2, wherein the plate-type resistive heating source comprises a material selected from the group consisting of carbon composites, SiC, graphite, and combinations thereof.

4. The linear type deposition source of claim 2, wherein the plate-type resistive heating source is adapted to provide a heating temperature ranging from about 400° C. to 900° C.

5. The linear type deposition source of claim 1, wherein the reflector is configured to prevent a heat transfer from the heating source to a direction of the outer wall.

6. The linear type deposition source of claim 5, wherein the reflector comprises at least two (2) reflectors.

7. The linear type deposition source of claim 5, wherein the reflector comprises at least four (4) reflectors.

8. The linear type deposition source of claim 1, further comprising another reflector, the two (2) reflectors between the outer wall and the heating source to prevent a heat transfer from the heating source to a direction of the outer wall.

9. A linear type deposition source comprising:
   a crucible in a deposition chamber, the crucible for evaporating materials in the crucible;
   a heating source for applying heat to the crucible;
   a housing for isolating the heat emitted from the heating source;
   a pair of supports between the heating source and the housing for supporting the heating source, the pair of supports comprising an inner support and an outer support, the inner support and the outer support each comprising an inside facing the heating source and an outside facing the housing;
   a reflector between the pair of supports for reflecting the heat from the heating source toward the crucible, the outside of the inner support and the inside of the outer support each facing the reflector;
   an outer wall for anchoring the crucible; and
   a nozzle unit for spraying the materials evaporated from the crucible,
   wherein the reflector is for preventing a heat transfer from the heating source to a direction of the outer wall,
   wherein the heating source is a plate-type heating source, and
   wherein the housing has a heat insulating part and a cooling jacket arranged at an outer side of the heat insulating part.

10. The linear type deposition source of claim 9, wherein the cooling jacket has a cooling water line configured for cooling water to flow through the cooling water line.

11. The linear type deposition source of claim 9, wherein the heat insulating part comprises a graphite felt.

12. The linear type deposition source of claim 9, wherein the heat insulating part is between the reflector and the cooling jacket.

13. A linear type deposition source comprising:
    a crucible in a deposition chamber, the crucible for evaporating materials in the crucible;
    a heating source for applying heat to the crucible;
    a housing for isolating the heat emitted from the heating source;
    a pair of supports between the heating source and the housing for supporting the heating source, the pair of supports comprising an inner support and an outer support, the inner support and the outer support each comprising an inside facing the heating source and an outside facing the housing;
    an outer wall for anchoring the crucible;
    a nozzle unit for spraying the materials evaporated from the crucible; and
    at least two (2) reflectors between the pair of supports, the at least two (2) reflectors for preventing a heat transfer from the heating source to a direction of the outer wall, the outside of the inner support and the inside of the outer support each facing the at least two reflectors,
    wherein the heating source is a plate-type heating source.

14. The linear type deposition source of claim 13, wherein the housing has a cooling water line adapted for cooling water to flow through the cooling water line.

* * * * *